US006771491B2

United States Patent
Tojo et al.

(10) Patent No.: US 6,771,491 B2
(45) Date of Patent: Aug. 3, 2004

(54) BATTERY PACK

(75) Inventors: Masaaki Tojo, Hirakata (JP); Takatoshi Matsui, Higashiosaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/181,062

(22) PCT Filed: Jan. 11, 2001

(86) PCT No.: PCT/JP01/00100

§ 371 (c)(1),
(2), (4) Date: Jul. 29, 2002

(87) PCT Pub. No.: WO01/52342

PCT Pub. Date: Jul. 19, 2001

(65) Prior Publication Data

US 2003/0076072 A1 Apr. 24, 2003

(30) Foreign Application Priority Data

Jan. 12, 2000 (JP) .......................... 2000-006269
Dec. 25, 2000 (JP) .......................... 2000-392398

(51) Int. Cl.[7] .............................................. H05K 5/00
(52) U.S. Cl. ...................... 361/679; 312/223.2; 320/24; 324/426
(58) Field of Search ................. 361/679–687, 361/724–727; 312/223.1–223.6; 320/31–32, 22–24, 43–44; 324/426–427

(56) References Cited

U.S. PATENT DOCUMENTS 5,563,496 A * 10/1996 McClure .................... 320/128

FOREIGN PATENT DOCUMENTS

| JP | 6-121466 | 4/1994 |
| JP | 8-138749 | 5/1996 |
| JP | 10-269107 | 10/1998 |
| JP | 11-225443 | 8/1999 |

* cited by examiner

Primary Examiner—Hung Van Duong
(74) Attorney, Agent, or Firm—Jordan and Hamburg LLP

(57) ABSTRACT

Firmware of a battery pack (2) is stored in a rewritable storage device such as a flash memory (8). When troubleshooting or performance improvement is needed, a personal computer main body (host equipment) (1) obtains up-to-date firmware from a storage medium or the Internet, and transmits it to a battery pack (2) via an SMBus (5) using a firmware transfer device (12). A firmware rewriting device (11) of the battery pack (2) rewrites the firmware stored in the flash memory (8) on the basis of the up-to-date firmware.

10 Claims, 3 Drawing Sheets

BATTERY PACK

TECHNICAL FIELD

The present invention relates to a battery power source device which is capable of electric power management by performing data transmission and reception between host equipment, which is driven by a battery power source, such as a portable personal computer, and a battery pack acting as the battery power source.

BACKGROUND ART

In general, a portable personal computer called a notebook-type personal computer or a mobile computer (hereafter simply referred to as the "personal computer") is driven by a battery power source. Employed as the battery power source is a battery pack including a rechargeable battery and a protective circuit for protecting the rechargeable battery from overcharging, overdischarging, or other troubles. In the protective circuit, at the instant when even only one of a plurality of rechargeable batteries connected in series with each other drops in voltage below a predetermined level, output is interrupted regardless of the total voltage in order to protect the rechargeable battery. In a personal computer, however, abrupt power shutdown causes data corruption, and therefore power shutdown needs to be made in accordance with a predetermined procedure. In light of this, a battery pack for use in a personal computer is equipped with a microcomputer incorporating firmware, thereby constituting an intelligent battery which is connected to a personal computer main body via a communication path.

As one example of intelligent batteries, there has been known a smart battery system. The battery pack includes a microcomputer, in addition to the protective circuit, to detect the remaining capacity, voltage, current, temperature, and other data on the rechargeable battery. Moreover, the microcomputer stores control data, and various data on the individual batteries such as the manufacture's name, serial number, and charging condition. Thereby, transmission and reception of charging/discharging control data on the rechargeable battery is performed between the battery pack, and a smart charger and a power management controller incorporated in the personal computer main body by way of a two-wire synchronous serial communication interface system. This allows the personal computer main body to perform optimal charging/discharging control for the rechargeable battery on the basis of the data transmitted from the microcomputer incorporated in the battery pack. Hence, power-saving control and prevention of deterioration in rechargeable battery quality are achieved. Further, it is possible to avoid a problem attributed to inadvertent power shutdown or the like occurring during the operation of the personal computer using the battery power source.

However, since the data of the battery pack is stored as firmware in a ROM mounted in the microcomputer, even if the need for troubleshooting or performance improvement comes about, the data of the battery pack cannot be updated. The changing of the firmware necessitates replacement of the microcomputer, which cannot be handled by users. Thus, the users are able to cope with neither troubleshooting nor performance improvement on their own, with the result that the data of the battery pack cannot be maintained optimal and up to date.

An object of the present invention is to provide a battery power source device that enables a personal computer main body to implement power management on the basis of optimal and up-to-date battery pack data at all times by making possible rewriting of firmware mounted in the battery pack.

DISCLOSURE OF THE INVENTION

To achieve the above object, according to a first aspect of the present invention, there is provided a battery power source device, constructed as a smart battery device, for performing data transmission and reception between a battery pack, which has a rechargeable battery and a battery management function for controlling charging and discharging of the rechargeable battery, and host equipment in which the battery pack is mounted, the battery pack and the host equipment being connected to each other by a communication path. The battery pack is provided with a rewritable storage device for storing firmware of the battery pack, and a firmware rewriting device for rewriting the firmware stored in the storage device. The host equipment is provided with a firmware transfer device for transferring up-to-date firmware inputted from a data input device to the battery pack via the communication path. In this construction, when the need for troubleshooting or performance improvement comes about, up-to-date firmware is inputted from the data input device. The up-to-date firmware is transferred through the communication path to the battery pack by the firmware transfer device, so that the firmware rewriting device updates the existing firmware. Hence, the battery pack is kept in an optimally and updatedly controlled state at all times under usage.

According to a second aspect of the invention, there is provided a battery power source device, constructed as a smart battery device, for performing data transmission and reception between a battery pack, which has a rechargeable battery and a battery management function for controlling charging and discharging of the rechargeable battery, and host equipment in which the battery pack is mounted, the battery pack and the host equipment being connected to each other by a communication path. The battery pack is provided with a rewritable storage device for storing firmware of the battery pack, and a firmware rewriting device for rewriting the firmware stored in the storage device. The host equipment is provided with an Internet access device for providing access to the Internet; an up-to-date firmware retrieval device for retrieving up-to-date firmware from an appropriate server after reading URL information stored in the storage device; and a firmware transfer device for transferring the up-to-date firmware to the battery pack via the communication path. In this construction, when the need for troubleshooting or performance improvement comes about, up-to-date firmware is retrieved by making access to a designated server using the Internet access device. The up-to-date firmware is transferred through the communication path to the battery pack by the firmware transfer device, so that the firmware rewriting device updates the existing firmware. Hence, the battery pack is kept in an optimally and updatedly controlled state at all times under usage.

In this construction, it is preferable to additionally provide a temporary storage device for temporarily storing up-to-date firmware retrieved over the Internet by the up-to-date firmware retrieval device. By so doing, even if up-to-date firmware cannot be retrieved properly due to abnormality or disconnection of communication lines occurring during downloading, the firmware of the battery pack is prevented from being rewritten based on inadequate new firmware. Since rewriting of the firmware is executed using the up-to-date firmware stored in the temporary storage device after completion of downloading, the battery pack is prevented from being rendered inoperative because of the execution of rewriting based on inadequate new firmware.

BEST MODE FOR CARRYING OUT THE INVENTION

Hereinafter, for a further understanding of the present invention, embodiments of the invention will be described with reference to the accompanying drawings. It should be noted that the subsequently-described embodiment is merely one example of how the invention can be applied, and thus the technical scope of the present invention should not be limited thereto.

Figure 1:
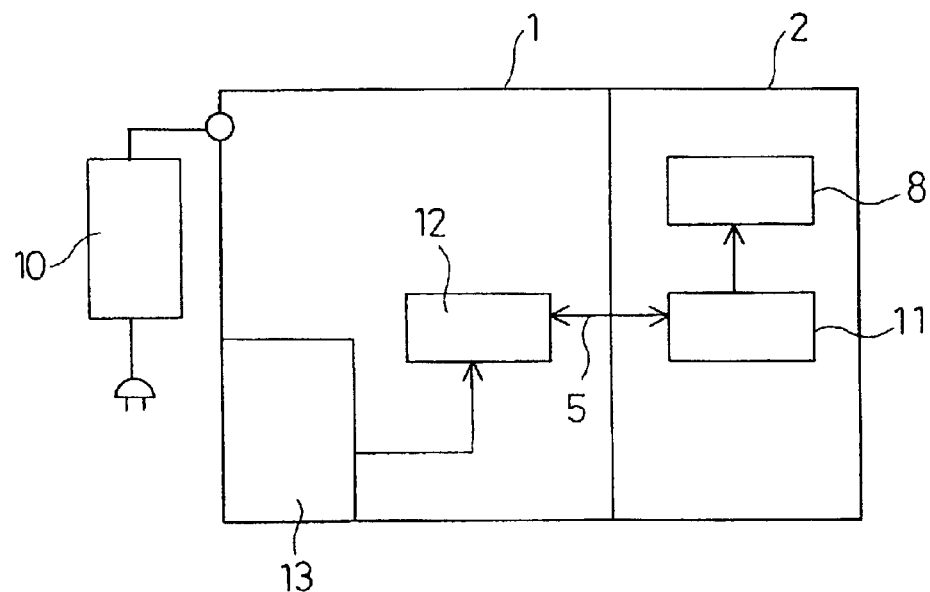
FIG. 1 is a block diagram showing a firmware rewriting configuration employed in a battery pack according to a first embodiment of the present invention.

A first embodiment of the present invention exemplifies a battery power source device applied to a notebook-type personal computer which is driven by a battery power source. As shown in FIG. 1, a personal computer main body (host equipment) 1 is operated by application of direct current fed from a battery pack (battery power source device) 2 mounted therein or direct current fed from an AC adapter 10. The personal computer main body 1 and the battery pack 2 are connected to each other by an SMBus (communication path) 5, which is built as a two-wire synchronous serial communication interface system, thereby constituting a smart battery system for performing power-management data transmission and reception between the main body 1 and the battery pack 2. The personal computer main body 1 is, when used in an environment in which the AC adapter 10 is connectable, namely, an environment in which utility power is available, operated by application of direct current fed from the AC adapter 10. Besides, the direct current is utilized as electric power for use in charging a rechargeable battery 3 of the battery pack 2. When used in an environment in which utility power is unavailable, the personal computer main body 1 is operated by application of direct current fed from the battery pack 2.

Figure 3:
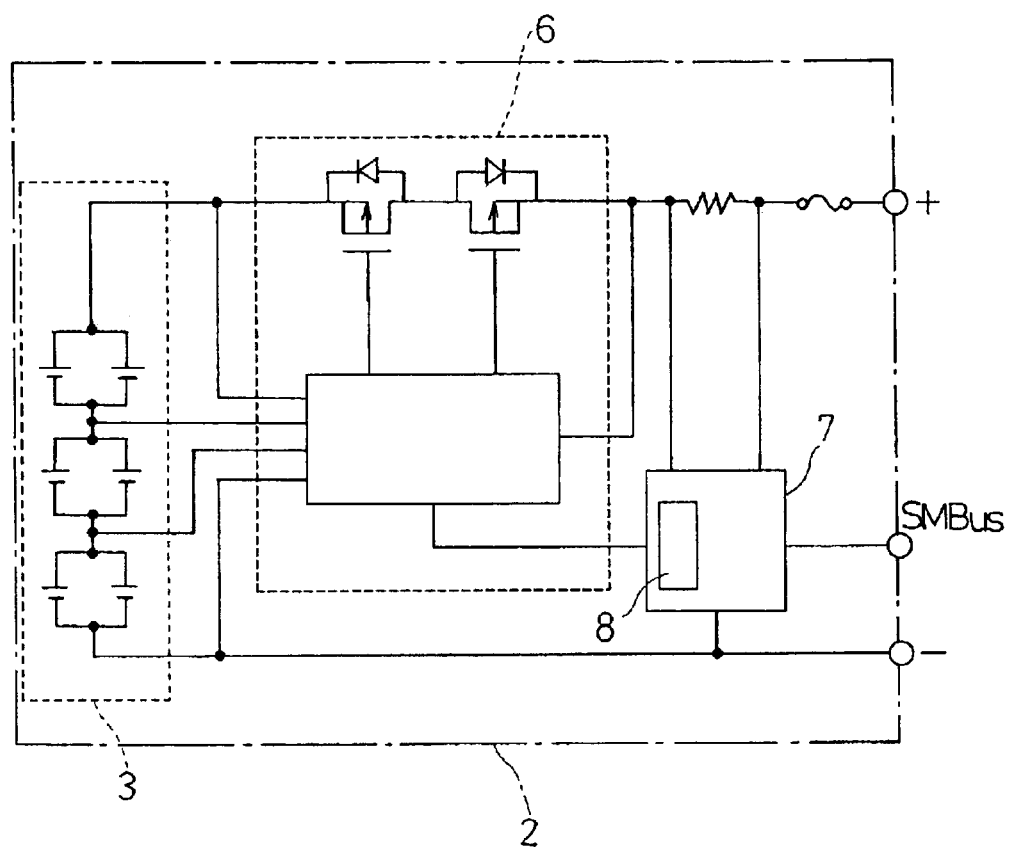
FIG. 3 is a block diagram showing an example of the structure of the battery pack.

As shown in FIG. 3, the battery pack 2 includes the rechargeable battery 3, a protective circuit 6, and a microcomputer 7. The rechargeable battery 3 is composed of a plurality of lithium-ion rechargeable batteries so as to obtain desired voltage and capacity. The protective circuit 6 serves to protect the rechargeable battery 3 from overcharge, overdischarge, overcurrent, and other inconveniences. The microcomputer 7 detects the status of the rechargeable battery 3, and also allows the personal computer main body 1 to conduct power management by performing data transmission and reception between the battery pack and the main body 1. The microcomputer 7 performs power-source control operation on the basis of firmware stored in a flash memory (a storage device) 8 incorporated therein. The microcomputer 7 detects the voltage, current, temperature, etc. of the rechargeable battery 3 and also calculates the remaining capacity of the battery. Moreover, the flash memory 8 stores the battery pack 2—specific data including the manufacturer's name, serial number, and charging conditions.

The personal computer main body 1 receives the data on the remaining capacity and voltage of the rechargeable battery 3 from the battery pack 2 by way of the SMBus 5. If the value of the data is equal to or less than a predetermined value, the personal computer main body 1 reads out the charging condition for the battery pack 2 stored in the flash memory 8, and then changes the charging condition in accordance with the status of the battery system as a whole. The resultant value is transmitted to a smart charger mounted in the personal computer main body 1. Whereupon, the smart charger starts charging on the battery pack 2 on the basis of the charging condition it receives, by exploiting direct current fed from the AC adapter 10. The personal computer main body 1 communicates with the battery pack 2 via the SMBus 5 to monitor the charging condition. When the capacity of the battery pack 2 reaches the level of the end-of-charging condition, charging is brought to an end.

Besides, the personal computer main body 1 receives battery-related data such as the remaining capacity and charging cycle from the battery pack 2, so as to indicate user-requested information on its display. Moreover, when the remaining capacity is equal to or less than a predetermined value, the personal computer main body 1 displays a warning to notify the users of the need for data backup. This system enables the users to conduct power management on their own during the use of the battery pack.

The charging/discharging control for the battery pack 2 is performed on the basis of the firmware stored in the flash memory 8. Consequently, when the need for troubleshooting or performance improvement comes about after the shipment of the personal computer main body 1 incorporating the battery pack 2, all that needs to be done is to rewrite the firmware. Firmware updating is performed in the following manner.

As shown in FIG. 1, the battery pack 2 is provided with a firmware rewriting device 11 for rewriting the firmware stored in the flash memory 8. The personal computer main body 1 is provided with a firmware transfer device 12 for transferring up-to-date firmware to the firmware rewriting device 11.

In a case where the firmware needs to be updated, a driving signal is fed from the personal computer main body 1 via the SMBus 5 to activate the firmware rewriting device 11. Note that it is possible to additionally provide the battery pack 2 with a switch for activating the firmware rewriting device 11.

The firmware transfer device 12 of the personal computer main body 1 reads out up-to-date firmware from a floppy disk unit (an input device) 13 into which a storage medium (floppy disk, in this case) storing the up-to-date firmware is inserted, and then transfers it to the firmware rewriting device 11 via the SMBus 5.

The firmware rewriting device 11 erases the outdated firmware stored in the flash memory 8 and writes the received up-to-date firmware into it. This firmware rewriting operation allows the battery pack 2 to be controlled in an up-to-date and optimal working condition.

Up-to-date firmware is downloadable from a designated Internet server by using the Internet access device provided in the personal computer main body 1.

Figure 2:
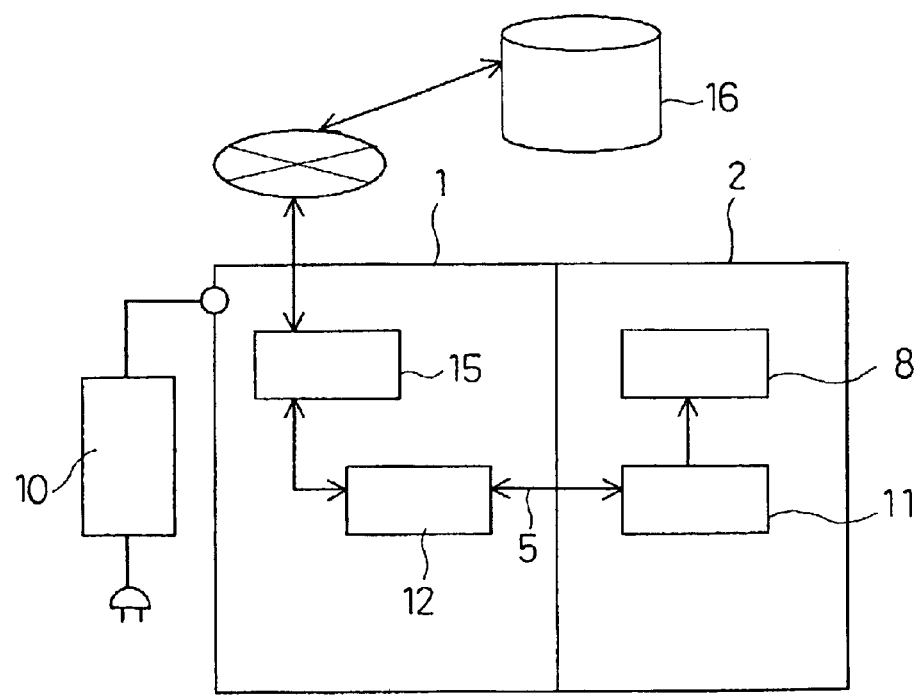
FIG. 2 is a block diagram showing a firmware rewriting configuration employed in a battery pack according to a second embodiment of the invention.

For example, as shown in FIG. 2, the flash memory 8 of the battery pack 2 stores URL information required for making access to the designated Internet server, and up-to-date firmware is prepared in the Internet server 16. The designated Internet server 16 can be installed at a site of the manufacturer of the personal computer main body 1 or the battery pack 2.

When the need for firmware updating comes about, by the firmware transfer device 12 of the personal computer main body 1, information including the manufacturer's name and serial number, as well as URL information, is retrieved from the flash memory 8 of the battery pack 2 via the SMBus 5.

With the URL information retrieved, the Internet access device 15 provides access to the designated Internet server 16 listed in the URL information. Then, in accordance with the data such as the manufacturer's name or serial number, an appropriate up-to-date firmware file is selected and downloaded.

Next, a driving signal is fed from the personal computer main body 1 via the SMBus 5 to activate the firmware rewriting device 11. Note that the firmware rewriting device 11 may be activated by operating the driving switch provided in the battery pack 2.

The firmware transfer device 12 of the personal computer main body 1 transfers the downloaded up-to-date firmware to the firmware rewriting device 11 via the SMBus 5. The firmware rewriting device 11 erases the outdated firmware stored in the flash memory 8 and writes the received up-to-date firmware into it. This firmware rewriting operation allows the battery pack 2 to be controlled in an up-to-date and optimal working condition.

In the case of downloading up-to-date firmware over the Internet, if disconnection or abnormality of communication lines occurs during the downloading, the firmware of the flash memory 8 is rewritten based on inadequate new firmware. This brings the battery pack 2 into an inoperative state. To avoid such a problem, by executing the rewriting after completion of downloading of up-to-date firmware, it is possible to prevent occurrence of malfunction due to imperfect firmware rewriting.

Figure 4:
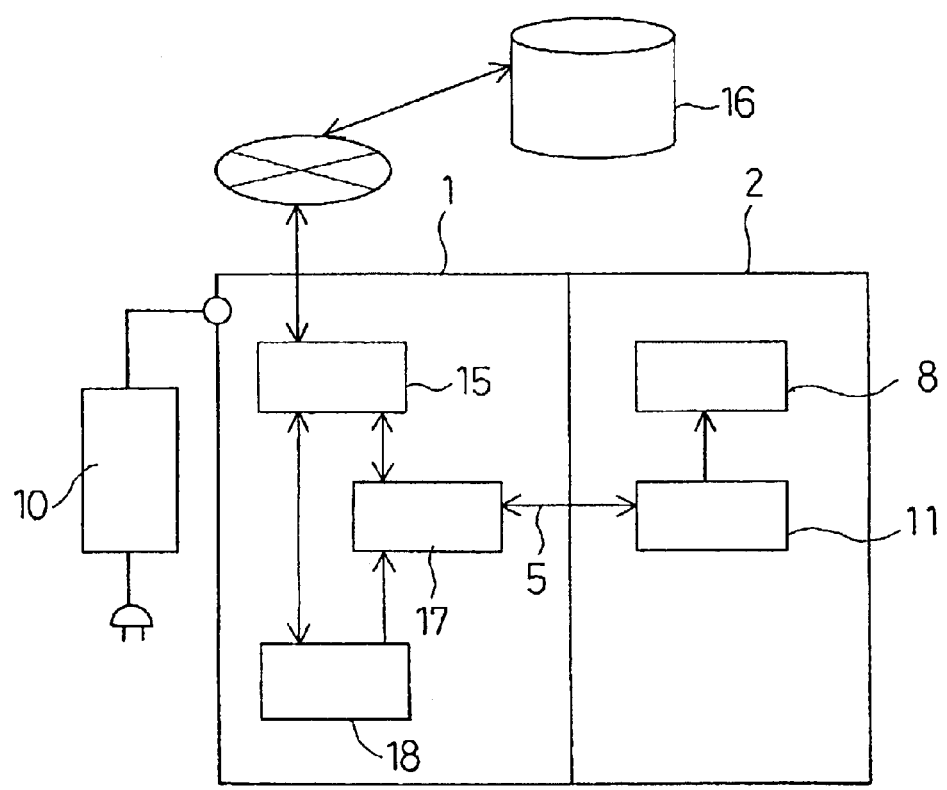
FIG. 4 is a block diagram showing a firmware rewriting configuration employed in the battery pack of the second embodiment in which a temporary storage device is additionally provided.

FIG. 4 shows the configuration in which the personal computer main body 1 is additionally provided with a temporary storage device 18 for temporarily storing up-to-date firmware downloaded over the Internet. When the need for firmware updating comes about, the Internet access device 15 provides access to the designated Internet server 16 listed in the URL information, so that an appropriate up-to-date firmware file is downloaded for the battery pack 2. The downloaded up-to-date firmware is written into the temporary storage device 18. Upon completion of the downloading, the firmware transfer device 17 reads out the up-to-date firmware recorded in the temporary storage device 18, and then transfers it to the firmware rewriting device 11 via the SMBus 5. The firmware rewriting device 11 erases the outdated firmware stored in the flash memory 8 and writes the received up-to-date firmware into it. The use of the temporary storage device 18 eliminates the possibility of rewriting based on inadequate new firmware. Moreover, if firmware updating is considered to be chargeable, with the previously-described method, even if downloading is completed imperfectly, it is inevitable that a billing charge is generated for the operation, causing various problems. By contrast, in the case of using the temporary storage device 18, when downloading is completed properly or when writing of up-to-date firmware into the flash memory 8 is completed, by sending a notice about normal completion of rewriting from the battery pack 2 side to the Internet server 16 through the Internet access device 15, it is possible to ensure that the data provider managing the Internet server 16 implements billing only when the operation is completed normally.

Although the practical example described hereinabove is designed to enable users to update the firmware of the battery pack 2 on their own, alternatively, after the deteriorated rechargeable battery 3 is replaced with a new one in the manufacturer of the battery pack 2, firmware updating may be achieved in conformity with the new rechargeable battery 3. This makes possible recycling of the battery pack 2.

INDUSTRIAL APPLICABILITY

As described heretofore, according to the present invention, the firmware of the battery pack is updated whenever the need for troubleshooting or performance improvement comes about. This brings about an advantage that the battery pack is controlled in an up-to-date and optimal state at all times under usage.

What is claimed is:

1. A battery power source device for performing data transmission and reception between a battery pack, which includes a rechargeable battery and a battery management function for controlling charging and discharging of the rechargeable battery, and host equipment in which the battery pack is mounted, the battery pack and the host equipment being connected to each other by a communication path,
   wherein the battery pack further comprises: a rewritable storage device for storing firmware of the battery pack for controlling the battery management function; and a firmware rewriting device for rewriting the firmware stored in the storage device, and
   the host equipment comprises a firmware transfer device for transferring up-to-date firmware, for controlling the battery management function, inputted from a data input device to the battery pack via the communication path, wherein the firmware rewriting device writes the up-to-date firmware to the storage device of the battery pack.

2. A battery power source device for performing data transmission and reception between a battery pack, which includes a rechargeable battery and a battery management function for controlling charging and discharging of the rechargeable battery, and host equipment in which the battery pack is mounted, the battery pack and the host equipment being connected to each other by a communication path,
   wherein the battery pack further comprises: a rewritable storage device for storing firmware of the battery pack for controlling the battery management function; and a firmware rewriting device for rewriting the firmware stored in the storage device, and
   the host equipment comprises: an Internet access device for providing access to the Internet; an up-to-date firmware retrieval device for retrieving, after reading URL information stored in the storage device, up-to-date firmware, for controlling the battery management function, from an appropriate server listed in the URL information; and a firmware transfer device for transferring the up-to-date firmware to the battery pack via the communication path, wherein the firmware rewriting device writes the up-to-date firmware to the storage device of the battery pack.

3. The battery power source device according to claim 2, further comprising a temporary storage device for temporarily storing the up-to-date firmware retrieved by the up-to-date firmware retrieval device over the Internet.

4. A battery power source device comprising:
a battery pack having a rechargeable battery;
a battery management unit controlling charging and discharging of the rechargeable battery;
host equipment;
said battery pack being mounted in said host equipment;
a communication path connecting the battery pack and the host equipment;
said battery pack including:
   a rewritable storage device storing firmware of the battery pack for controlling the battery management unit; and
   a firmware rewriting device rewriting the firmware stored in the storage device;
said host equipment including a firmware transfer device transferring up-to-date firmware inputted from a data input device to the battery pack via the communication path; and
said firmware rewriting device rewriting the firmware stored in the storage device with the up-to-date firmware to effect updated charging and discharging of the rechargeable battery by the battery management unit.

5. A battery power source device comprising:
a battery pack having a rechargeable battery;
a battery management unit for controlling charging and discharging of the rechargeable battery;
host equipment;
said battery pack being mounted in said host equipment;
a communication path connecting the battery pack and the host equipment;
said battery pack including:
   a rewritable storage device storing firmware of the battery pack for controlling the battery management unit; and
   a firmware rewriting device rewriting the firmware stored in the storage device, and
the host equipment including:
   an Internet access device providing access to the Internet;
   an up-to-date firmware retrieval device for retrieving, after reading URL information stored in the storage device, up-to-date firmware, for controlling the battery management unit, from a server listed in the URL information; and
   a firmware transfer device transferring the up-to-date firmware to the battery pack via the communication path; and
said firmware rewriting device rewriting the firmware stored in the storage device with the up-to-date firmware to effect updated charging and discharging of the rechargeable battery by the battery management unit.

6. The battery power source device according to claim 5, further comprising a temporary storage device temporarily storing the up-to-date firmware retrieved by the up-to-date firmware retrieval device over the Internet.

7. A battery system, comprising:
a battery module including:
   a rechargeable battery;
   a battery charging control unit for monitoring and controlling charging of said rechargeable battery;
   a re-writeable storage unit storing firmware for controlling said battery charging control unit; and
   a writing device for receiving updated firmware and writing the updated firmware to the re-writeable storage unit to effect updated control of said battery charging control unit;
a host device powered at least in part by said battery module, the host device including:
   an input device for receiving the updated firmware;
   a communication path interfacing with said writing device and transferring the updated firmware from said input device to said writing device; and
   a battery charger responsive to said battery charging control unit of said battery module for charging said rechargeable battery;
wherein said writing device writes the updated firmware received from the communication path to the re-writeable storage unit to effect the updated control of said battery charger.

8. The battery system according to claim 7, wherein the host device further includes a temporary storage device temporarily storing the updated firmware received by the data input device until at least a complete copy of the updated firmware is received before the updated firmware is transferred to said writing device of said battery module.

9. The battery system according to claim 7, wherein said input device includes:
   an Internet access device providing access to the Internet; and
   a firmware retrieval device for retrieving, after reading URL information stored in the storage device, said updated firmware from a server listed in the URL information.

10. The battery system according to claim 8, wherein said input device includes:
   an Internet access device providing access to the Internet; and
   a firmware retrieval device for retrieving, after reading URL information stored in the storage device, said updated firmware from a server listed in the URL information.

* * * * *